United States Patent
Langer

(10) Patent No.: US 9,467,095 B2
(45) Date of Patent: Oct. 11, 2016

(54) SWITCHABLE DUAL CORE POWER AMPLIFIER

(71) Applicant: Intel Corporation, Santa Clara, CA (US)

(72) Inventor: Andreas Langer, Lohhof (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/512,697

(22) Filed: Oct. 13, 2014

(65) Prior Publication Data

US 2016/0105151 A1    Apr. 14, 2016

(51) Int. Cl.

| H03F 1/14 | (2006.01) |
|---|---|
| H03F 1/02 | (2006.01) |
| H03F 3/19 | (2006.01) |
| H03F 3/21 | (2006.01) |
| H03F 1/32 | (2006.01) |
| H03F 3/195 | (2006.01) |
| H03F 3/24 | (2006.01) |
| H04B 1/00 | (2006.01) |
| H04B 1/04 | (2006.01) |

(52) U.S. Cl.
CPC .......... *H03F 1/0205* (2013.01); *H03F 1/0227* (2013.01); *H03F 1/0277* (2013.01); *H03F 1/32* (2013.01); *H03F 3/19* (2013.01); *H03F 3/195* (2013.01); *H03F 3/211* (2013.01); *H03F 3/245* (2013.01); *H04B 1/006* (2013.01); *H04B 1/0475* (2013.01); *H04B 1/0483* (2013.01); *H03F 2200/102* (2013.01); *H03F 2200/111* (2013.01); *H03F 2200/411* (2013.01); *H03F 2200/451* (2013.01); *H03F 2203/21106* (2013.01); *H03F 2203/21145* (2013.01);

(Continued)

(58) Field of Classification Search
CPC ...... H03G 3/3042; H03G 3/004; H03G 3/22; H03G 7/02; H03F 1/0222; H03F 1/0227; H03F 1/0261; H03F 1/08; H03F 1/56; H03F 1/302; H03F 3/191; H03F 3/211; H03F 3/602; H03F 3/604; H03F 2200/18; H03F 2200/102; H04B 1/1018; H04B 1/1623
USPC ....... 330/127, 130, 134, 135, 136, 200, 285, 330/295, 296, 297, 302, 51
See application file for complete search history.

(56) References Cited

U.S. PATENT DOCUMENTS

| 7,672,648 B1 | 3/2010 | Groe et al. |
|---|---|---|
| 8,718,582 B2 | 5/2014 | See et al. |

(Continued)

OTHER PUBLICATIONS

Junghwan Moon, et al.; "A Multimode/Multiband Envelope Tracking Transmitter with Broadband Saturated Power Amplifier"; IEEE; 2011; p. 1-4.

(Continued)

*Primary Examiner* — Steven J Mottola
*Assistant Examiner* — Hafizur Rahman
(74) *Attorney, Agent, or Firm* — Eschweiler & Associates, LLC

(57) ABSTRACT

A dual mode, dual core power amplifier (PA) device includes a plurality of PA chains that generate output power according to an envelope tracking mode and a non-envelope tracking mode. The different modes can be selected to generate output power based on a set of predetermined criteria, which can be related to an input signal received by the system and related to a target power. A first PA chain with one or more PA cores is configured to operate in the envelope tracking mode based on at least a portion of the predetermined criteria being identified in the input signal and to generate output power with an envelope voltage supply that changes with an envelope of the input signal. In addition, a second PA chain with one or more PA cores can operate in a constant voltage supply mode or the non-envelope tracking mode according to the predetermined criteria.

23 Claims, 5 Drawing Sheets

(52) U.S. Cl.
CPC ........... *H03F 2203/7209* (2013.01); *H03F 2203/7215* (2013.01); *H04B 2001/0425* (2013.01)

(56) References Cited

U.S. PATENT DOCUMENTS

| | | | |
|---|---|---|---|
| 8,749,307 B2* | 6/2014 | Zhu | H03F 1/0233 |
| | | | 330/129 |
| 8,841,967 B2 | 9/2014 | Drogi | |
| 2013/0135043 A1 | 5/2013 | Hietala et al. | |
| 2014/0103995 A1 | 4/2014 | Langer | |
| 2014/0184337 A1* | 7/2014 | Nobbe | H03F 1/0227 |
| | | | 330/296 |
| 2014/0266462 A1 | 9/2014 | Schirmann et al. | |

OTHER PUBLICATIONS

European Search Report Dated Mar. 1, 2016 EP Application 15184268.9-1805.

* cited by examiner

SWITCHABLE DUAL CORE POWER AMPLIFIER

FIELD

The present disclosure relates to power amplifiers, and more specifically, a switchable dual core power amplifier.

BACKGROUND

High-efficiency power amplifiers (PAs) offer valuable solutions in mobile wireless communication devices. With modern wireless systems, modulation formats have a high peak-average ratio (PAR) and linear PAs have low average efficiency. Power supply control schemes such as envelope tracking offer a high potential for a high average efficiency operation for high PAR signals. However, a bottleneck for achieving superior current consumption performance in PAs is the efficiency of the power amplifier (PA) during envelope tracking operations. A potential downside to PAs operating with envelope tracking is that the PA can demonstrate strong AMAM- and AMPM conversion. Thus, to maintain linearity the PA often utilizes digital distortion schemes (e.g., digital pre-distortion (DPD)) in operation, which can pose a constraint because such implementations (e.g., DPD) accompany complex signal processing in the transceiver or the baseband processor, or matured algorithms (e.g., fast factory calibration), and can be more sensitive to antenna mismatch. DPD, for example, can become even more complex in the context of uplink (UL) carrier aggregation, in which an increased transmission bandwidth could be up to 100 MHz by an LTE advanced standard. If the PA is loaded by a duplexer, the AMAM and AMPM characteristic of the PA can significantly change within the transmission bandwidth due to resonances in the duplex filter, which introduce memory effects in the transmission chain, and further complicate distortion techniques or even render them nearly impossible for wideband transmission signals.

DETAILED DESCRIPTION

Figure 1:
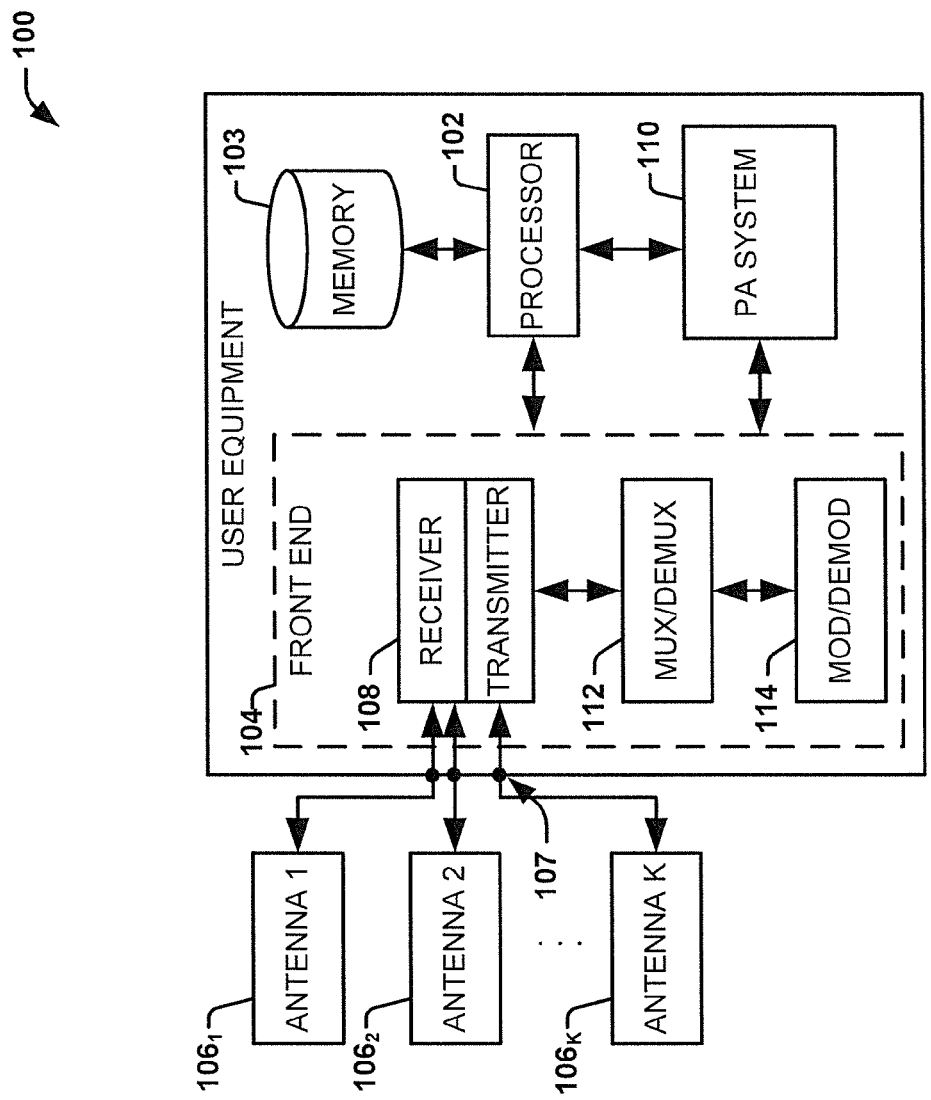
FIG. 1 is a block diagram illustrating a PA system or device according to various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies of power control schemes for PAs, various aspects are described for utilizing an envelope tracking mode and a non-envelope tracking mode in a PA system that comprises a dual PA core system. For example, the dual core PA system can comprise a first PA chain with at least one PA and a second PA chain with at least one other PA that respectively correspond to the different operational modes (envelope tracking mode and non-envelope tracking mode) for generating a power output. In one embodiment, the PA system enables a highest efficiency power generation in the envelope tracking mode of operation while operating independently of digital distortion (e.g., digital pre-distortion (DPD)), distortion correction in a non-envelope tracking mode of operation.

The power amplifier system can comprise a first power amplifier chain and a second power amplifier chain, in which a chain referred to herein can comprise one or more components (e.g., at least one PA, power transistors, matching components or other like components) coupled together in a communication path (e.g., a wired, a conducting path or other processing pathway) for the generation of output power. The first PA chain can comprise one or more first power amplifier cores, and the second PA chain can comprise one or more second power amplifier cores. A PA core can be understood as a PA sub-system or PA package, in which one or more PAs are integrated with one or more PA power transistors, one or more input matching components, one or more inter-stage matching components, or one or more output matching components, for example, which can support operation of the PAs of the respective chain.

In another embodiment, the first PA chain and the second PA chain can be selectively activated depending upon one or more predetermined criteria. In one aspect, the PA chains can be coupled to a switching component that can operate to switch between at least two PA chains according to the set (one or more) of predetermined criteria or various characteristics related to the input signals received or to a target power, for example. The predetermined criteria or characteristics can be used to determine an activated state of one PA chain over the other for operation in either the non-envelope tracking mode or another mode of operation without a switch or with the switching component. In another aspect, a switch or the switching component that includes the switch can be configured to couple each PA chain or activate a switching state of the PA system to be in the envelope tracking mode or the non-envelope tracking mode (e.g., an average power tracking mode, a constant supply mode or the like). The predetermined criteria, for example, can comprise criteria or characteristics that are related to the input signal at an input terminal of the PA system (e.g., a radio frequency signal or the like). Thus, the first PA chain can be optimized and configured differently with respect to the second PA chain in order to respond differently to different input signals at the input terminal. Additional aspects and details of the disclosure are further described below with reference to figures.

Referring to FIG. 1, illustrated is an exemplary user equipment or mobile communication device 100 that can be utilized with one or more aspects of the PA systems or PA devices described according to various aspects. The mobile communication device 100, for example, comprises a digital baseband processor 102 that can be coupled to a data store or memory 103, a front end 104 (e.g., a radio frequency (RF) front end or the like) and a set (one or more) of antenna ports 107 for connecting to a set of antennas $106_1$ to $106_k$ (k being a positive integer) that can receive and transmit signals to and from one or more wireless devices such as access points, access terminals, wireless ports, routers and so forth, which can operate within a radio access network or other communication network generated via a network device.

The front end 104 can include a communication platform, which comprises electronic components and associated circuitry that provide for processing, manipulation or shaping of received or transmitted signals via one or more receivers or transmitters 108, a mux/demux component 112, and a mod/demod component 114. The front end 104, for example, is coupled to the digital baseband processor 102 and the set of antenna ports 107, in which the set of antennas $106_1$ to $106_k$ can be part of the front end. In one aspect, the mobile communication device 100 can comprise a PA system 110 that operates as a dual mode, dual core PA device as part of or coupled to the digital baseband processor 102 or the RF frontend 104.

The mobile communication device 100 also includes a processor 102 or a controller that can operate to provide or control one or more components of the mobile device 100. For example, the processor 102 can confer functionality, at least in part, to substantially any electronic component within the mobile communication device 100, in accordance with aspects of the disclosure. As an example, the processor can be configured to execute, at least in part, executable instructions that control various modes of the PA system 110 as a multi-mode operation chipset that affords different power generation operations for input signals at the antenna ports 107, an input terminal or other terminal based on one or more characteristics of the input signal.

The processor 102 can operate to enable the mobile communication device 100 to process data (e.g., symbols, bits, or chips) for multiplexing/demultiplexing with the mux/demux component 112, or modulation/demodulation via the mod/demod component 114, such as implementing direct and inverse fast Fourier transforms, selection of modulation rates, selection of data packet formats, inter-packet times, etc. Memory 103 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

For example, the processor 102 or other component can detect or identify the predetermined characteristics utilized for the selection of a mode of operation (e.g., an envelope tracking mode, a constant supply voltage mode, an average power tracking mode, or the other mode of power output generation) for the PA system 110. In one embodiment, these predetermined characteristics can include a spectrum characteristic, a number of spectrum gaps for one or more modes of operation, a bandwidth threshold, a continuity/contiguity level of an input signal, a number of spectral clusters of the input signal, a distance between spectral clusters, if present, in the input signal, or a class or category of input signal (e.g., as LTE, 3GPP, another legacy signal, or the like).

The processor 102 is functionally and/or communicatively coupled (e.g., through a memory bus) to memory 103 in order to store or retrieve information necessary to operate and confer functionality, at least in part, to communication platform or front end 104, the PA system 110 and substantially any other operational aspects of the PA system 110 as a multi-mode PA system for the mobile 100.

Figure 2:
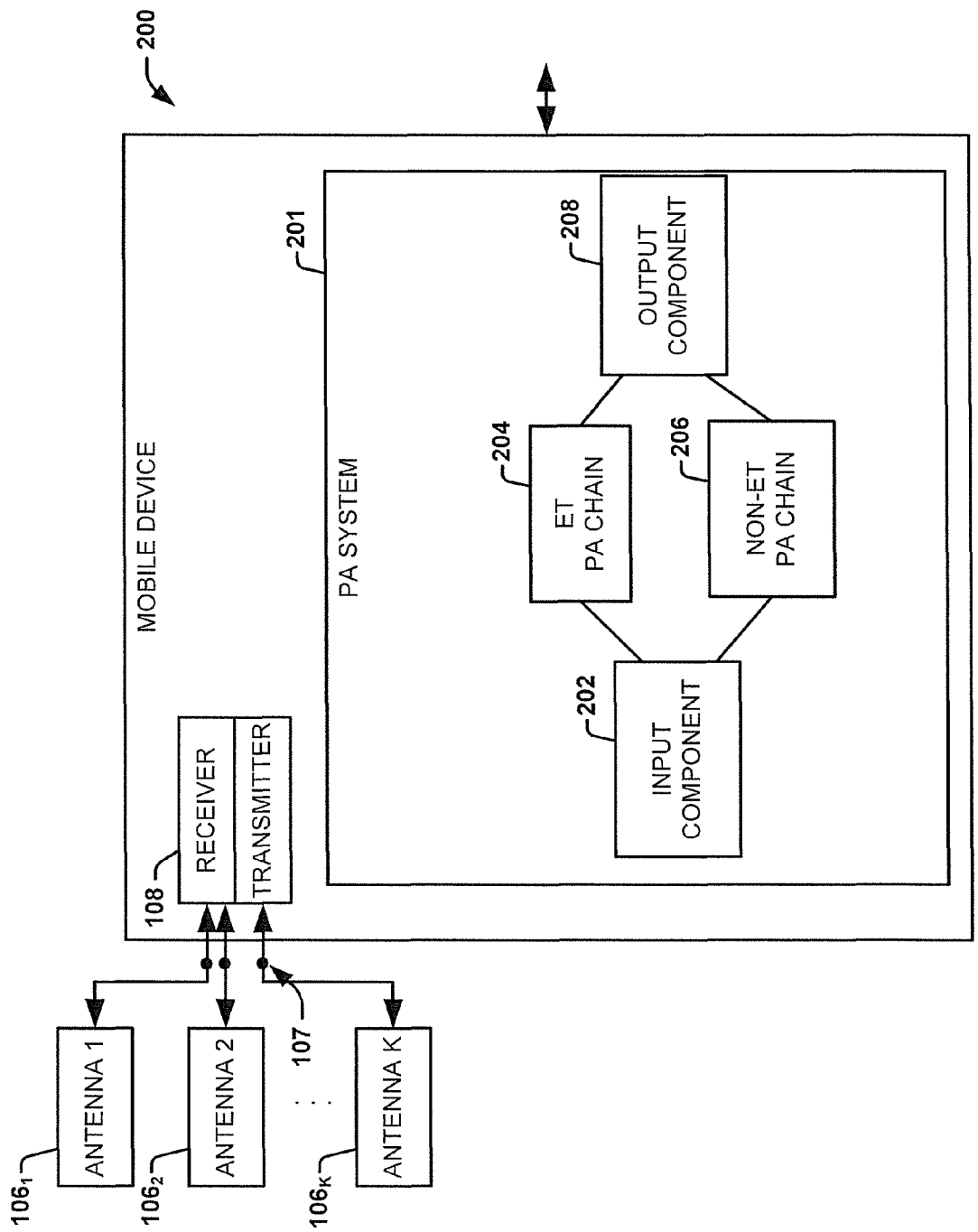
FIG. 2 is a block diagram illustrating another PA system or device according to various aspects described.

Referring to FIG. 2, illustrated is another example of a PA system 201 of a mobile device 200 that operates to generate an output power for input signals according to one or more aspects. The PA system 201 can operate as a multi-mode PA device with multiple PA cores. As discussed above, a PA core can be a PA sub-system that includes one or more power transistors, input matching components, inter-stage matching components or output matching components, as well as one or more power amplifiers coupled together in a PA chain or PA communication pathway with one or more additional components coupled together for operation.

The PA system 201 comprises an input component 202 that receives on or more input signals, such as one or more RF signals, a first PA chain (labeled ET PA chain) 204, a second PA chain (labeled non-ET PA chain) 206, and an output component 208 for providing an output signal (e.g., an electrical signal, an output power, or the like). The PA system 201 comprises a plurality of PA chains that can operate differently from one another for different signals based on characteristics related to the input signal(s) being received at the input component 202 or at an input terminal, as well as related to various PA specifications of the first PA chain 204, the second PA chain 206 or target power. In one embodiment, the first PA chain 204 is configured operate in an envelope tracking mode of operation for generating an envelope voltage that is supplied to at least one power amplifier core (e.g., a radio frequency PA or the like). In another embodiment, the second PA chain 206 is configured to operate in a non-envelope tracking mode of operation such as an average power tracking mode with a constant supply voltage that does not change according to the envelope of an input signal. Based on the predetermined criteria, the PA chain 204 can be activated to operate in the envelope tracking mode or the PA chain 206 can be activated operate for power generation in the non-envelope tracking mode. As the predetermined criteria can dynamically change, so can the activation of the PA chains 204, 206 change as a function of the changing predetermined criteria so that one PA chain is operational at a time.

The first PA chain 204 and the second PA chain 206 each comprise one or more power amplifiers for generation of an output power at an output terminal or the output component 208 having an output terminal. In one embodiment, the first PA chain 204 and the second PA chain 206 operate in different modes of operation according to the PA cores of each PA chain 204, 206 being activated independently and comprising particular differences from one another; while both being configured to generate an optimal power efficiency by generating approximately a same or a similar maximum output power (e.g., about 28 dBm or greater) in approximately a same frequency range. For example, the first PA chain 204 can comprise PAs that are optimized for envelope tracking, and thus provide high or higher peak efficiency when operating in an envelope tracking mode, as compared to the second PA chain 206. Additionally, the second PA chain 206 can be optimized for operating with a high or higher-peak linearity in the non-envelope tracking mode or average power tracking mode with a constant voltage supplied to the PA cores of the PA chain 206, as compared to the first PA chain 204.

The PA system 201 can operate to switch between the envelope tracking mode and the non-envelope tracking mode based on a set of predetermined criteria by switching between generating an output power being generated at the output component 208 via the first PA chain 204 and the second PA chain 206. The predetermined criteria can comprise, for example, a set of input signal characteristics that is associated with or related to the input signal or a target power output. As the input signal characteristics change, so can the mode of power generation in the PA system 201 so that the first PA chain 204 operates to generate power in the envelope tracking mode in response to one set of input signal characteristics being identified, while the second PA chain 206 operates to generate power in the non-envelope tracking mode in response to a different set of input signal characteristics being identified. The set of predetermined criteria can thus include the signal characteristics. The signal characteristics can be characteristics related to the input signal, which can be identified or detected by a controller (e.g., processor 102), a sensor or other like component operatively coupled to the input component 202 of the PA system 201, the first PA chain 204, the second PA chain 206 or other PA system component, for example. These signal characteristics can relate to the input signal, as well as the PAs of each PA chain 204, 206, or a target power level, for example, and can be identified dynamically or on-the-fly as the input signals are received by the mobile device 200, the PA system 201 or at the input component 202.

The predetermined criteria, for example, can comprise characteristics related to input signals, a target power level, or PA specifications and include one or more predefined conditions such as whether a threshold has been satisfied with respect to the characteristics. The characteristics or conditions can include a spectrum characteristic of the input signal at the input terminal, a bandwidth of the input signal, a contiguity of the spectrum characteristic, or a number of spectral clusters, as well as a distance between spectral clusters in response to a spectrum of the input signal being non-contiguous.

In another embodiment, the first PA chain 204 can operate with one or more PA cores at highest efficiency by utilizing digital distortion techniques (e.g., a digital pre-distortion), which facilitates a distortion signal to the PA cores to reduce, mitigate or eliminate non-linearity components in the power generation or that are present in the output power being generated at an operating frequency within a saturation or at a compression point of operation. On the other hand, the second PA chain 206 can operate with one or more PA cores that generate an output power independently of or without a distortion signal or distortion correction from distortion components/techniques while operating in the non-envelope tracking mode for power generation at a maximum output power at a same frequency (as the PAs of the first PA chain 204) in a linear or non-saturated state of operation.

In another embodiment, the PA cores of the first PA chain 204 can operate at a lower saturated power for a given supply voltage compared to the PA cores of the second PA chain 206. By selecting the PA chains 204 and 206 based on the predetermined criteria for different input signals, the complexity of a fast DC-to-DC converter (not shown) can be significantly reduced while PCB area and cost can be saved at the same time. In another embodiment, the PA system 201 can be completely integrated with the PA chain 204 as an envelope tracking (ET) power amplifier chain 204 and the PA chain 206 as a non-ET chain, such as on a System on a Chip (SoC), a Wi-Fi SoC, or a same transistor die (e.g., on a same HBT die), where cost and power consumption can be important considerations.

Figure 3:
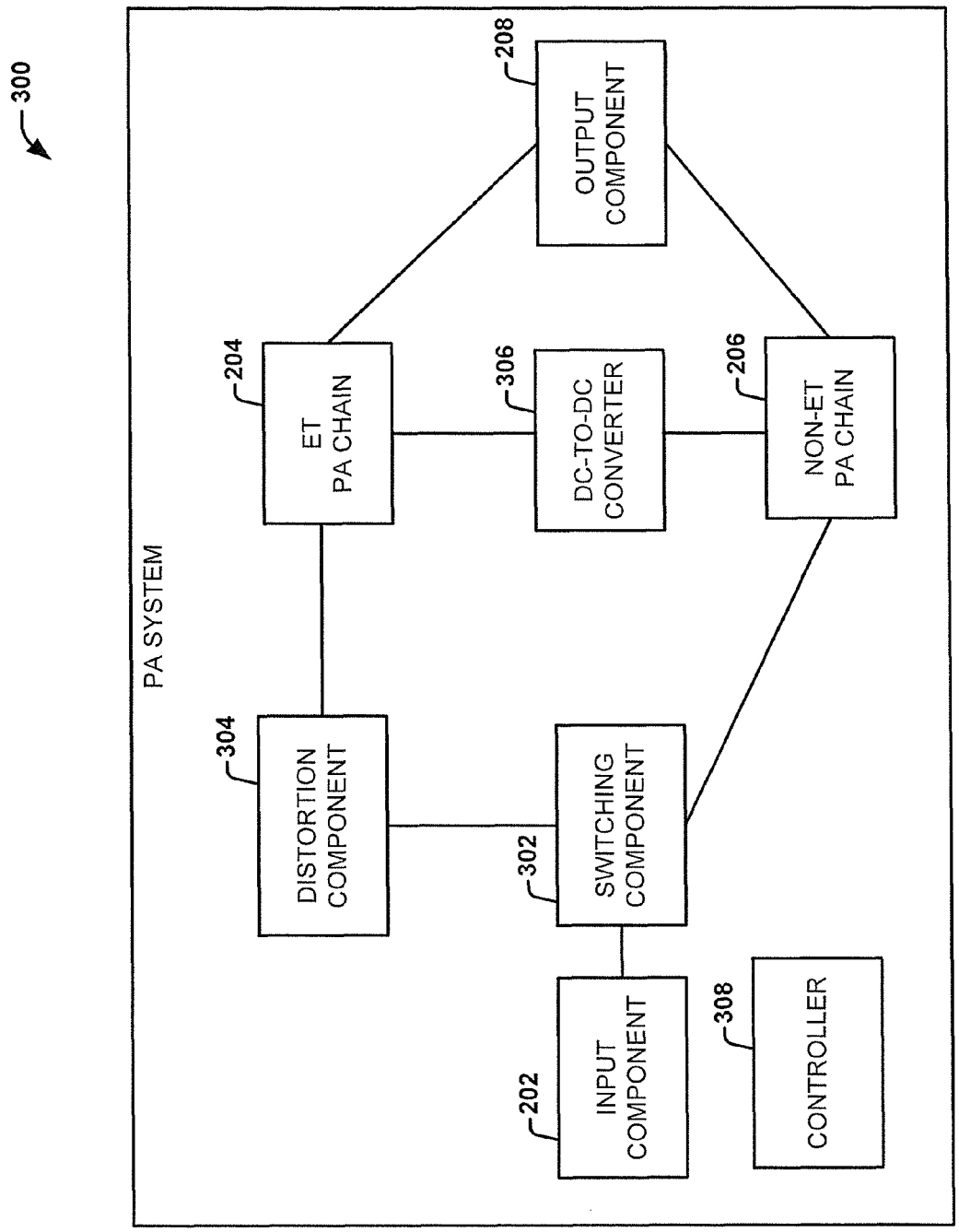
FIG. 3 is a block diagram illustrating another PA system or device according to various aspects described.

Referring now to FIG. 3, illustrated is another example of a PA system 300 in accordance with various aspects being described. The PA system 300 operates as a dual mode, dual core PA device comprising similar components as discussed above and a switching component 302, a distortion component 304, and a DC-to-DC converter 306.

The PA system 300 operates to provide optimal current consumption in an envelope tracking mode via at least one PA of the ET PA chain 204 while supporting a non-envelope tracking mode (e.g., an average power tracking mode or a constant supply mode) via at least one other PA of the non-ET PA chain 206, in which the PA of each chains 204, 206 can generate a similar, a substantially equal or an approximately equal maximum power. Additionally or alternatively, an equal maximum power can be generated within a same range of output power at a same frequency or frequency range by the PA chains 204, 206. Having a dual PA core with a plurality of operating modes enables optimized power to be achieved without requiring a digital pre-distortion or other distortion component via the distortion component 304 to be utilized in the non-envelope tracking PA chain 206, which enables a high or higher linearity, in comparison to the envelope tracking (ET) PA chain 204, in response to operating with a constant PA supply voltage. The PA system 300 therefore enables a lowest current consumption or a highest linearity and enables a less complex DC-to-DC converter architecture as a result.

In another embodiment, the PA current consumption in a wireless system across the entire output power range is optimized by a DC-to-DC converter 306, which is coupled to the ET PA chain 204 and the non-ET PA chain 206 to provide supply voltage(s). Depending upon the output power to be achieved at an output terminal or the output component 208, the DC-to-DC converter 306 operates to adjust the output voltage thereat. The lower the output power, the lower the required PA supply voltage. Due to a voltage conversion from a battery voltage, or a DC source, down to a lower PA supply voltage, the battery current can be reduced. The DC-to-DC converter 306 can operate based on a target power (or average power) as expected or predicted in a next period of time during operation, which can be in an average power tracking (APT) operational mode, for example. In one example, the DC-to-DC converter 306 comprises one or more Fast DC-to-DC converters that operate as envelope tracking DC-to-DC converters (ET DCDC converters) or ET modulators, which further reduce a current.

Envelope tracking comprises an approach or technique in the PA systems being described operating in the ET mode, in which the power supply voltage applied to the PA in the ET PA chain 204 is continuously adjusted to ensure that the PA of the ET PA chain 204 operates at a peak or a high efficiency for a given instantaneous output target. In another aspect, the PA can operate close to or at about peak efficiency over a wider range of instantaneous output power levels since the instantaneous PA supply voltage is selected such that the PA operates in or close to saturation for the instantaneous output power. As such, the voltage supply from the DC-to-DC converter 306 (e.g., an ET DCDC converter) to the ET PA chain 204 is not constant, but rather the supply voltage (e.g., a Vcc) of the ET PA chain 204 depends upon or varies based on an instantaneous envelope of a signal being received, such as a modulated baseband signal, for example. This modulated baseband signal, for example, can result from one or more system processing components (not shown), such as a CORDIC algorithm, followed by a delay adjustment to compensate for a different delay in a main signal path (RF signal generation path) and an envelope path, which is shaped (or pre-distorted) via the distortion component 304. The distortion component 304, for example, can provide an inverse non-linearity signal based on the non-linearity of the PA chain 204 or other component that negates or reduces the non-linearity to the PA chain 204. The signal path can then proceed with a digital-to-analog conversion, for example, and apply the output to the DC-to-DC converter to generate a variable PA supply voltage for the ET PA chain 204 in ET mode.

The DC-to-DC converter 306 can operate to follow an instantaneous envelope of the RF signal, which removes the voltage headroom and further increases the system efficiency. For example, an optimized system with an ET DCDC as the DC-to-DC converter 306 can reduce a battery current of a long term evolution (LTE) signal by about 20% at maximum output power relative to a standard DCDC converter that follows the average power.

The switching component 302 can comprise one or more switches, such as transistor switches, or other switching components such as a single-pole double-throw, a double-pole single-throw, a double-pole double-throw, or other like switching component that can be utilized to switch or couple the input component 202 as a main signal path to the non-ET PA chain 206 or to the ET PA chain 204 based on one or more characteristics of the input signal or desired output. In addition or alternatively, the switching component 302 can operate to activate the ET mode of operation or the non-ET mode of operation. For example, the switching component 302 can operate to couple an input to the ET PA chain 204 for operation or to the non-ET PA chain 206.

In one embodiment, the controller 308, for example, can operate to analyze input signal data and communicate to any one of the components of the system to control the switching component 302, a bias to the PA chains 204, 206, or retrieve data related to the target output or the input signals. The controller 308, for example, can ascertain characteristics about the PA chains 204, 206 and the input signals dynamically and communicate to the switching component 302, which in turn selects a path to open, either the ET PA chain 204 to operate and generate an output power with peak or maximum output power with a lowest current consumption or the non-ET PA chain 206 where ET mode is not efficient and high linearity can be utilized in a non-ET mode of operating.

The non-ET mode of operating involves a selection of the non-envelope tracking PA chain 206 by the switching component 302 as a function of the predetermined criteria, which are related to the input signals or target power levels. The non-ET mode can be selected in the average power tracking (APT) mode power range (a power range below a breakeven power where the ET mode efficiency drops below an APT mode efficiency). In addition, the non-ET mode can be selected for critical LTE advanced use cases (other 3GPP use cases, or other Legacy signal use cases) at maximum power levels where the ET mode is not as efficient, for example, in which high bandwidth requirements exists (e.g., above 20 to 40 MHz) such as up to, or more than, 100 MHz. The non-ET mode or APT mode is linear or has high-peak linearity such that the baseline linearity is good enough to meet 3GPP linearity targets in the signal processing without a digital distortion component or distortion mitigation processes via the distortion component 304, for example. In this mode, the PA of the non-ET chain operates in linearity without distortion by not operating in a saturation region of operation or at a compression point of operation. These functions enable support of high LTE advanced bandwidth (e.g., up to or greater than 100 MHz) and critical LTE use cases with a reasonable implementation effort and cost.

In another aspect, two independent PA cores operate as the ET PA chain 204 and the non-ET PA chain 206 in a PA device and comprise different load-lines assigned to each PA core, in which each comprises a different PA supply voltage range while being operable to still achieve the same or approximately the same or similar maximum output power. A load-line can be a graphical analysis, or another representation of various operational constraints, for example, such as a curve along a current versus a voltage graph. The load line, sometimes a straight line, can represent the response of a linear part of a circuit or component, connected to the device in question, (e.g., the PA chain or a PA of a PA chain or PA core), in which above the linear part can be a saturation or a compression region of operation with non-linearity predominating in the operational functioning of the PA device.

In another embodiment, in the ET mode, the PA(s) of the ET PA chain 204 comprise a higher load-line to obtain a high-peak saturated PA efficiency and optimal envelope tracking efficiency. In the ET mode, the PA of the ET PA chain 204 operates in the saturation region or at a compression point. In the non-ET mode, the PA(s) of the non-ET PA chain 206 comprises a lower load-line to avoid DC boost capabilities, which, in turn, reduces hardware complexity in the envelope tracking components, lowers cost, and improves performance with dynamic flexibility.

Figure 4:
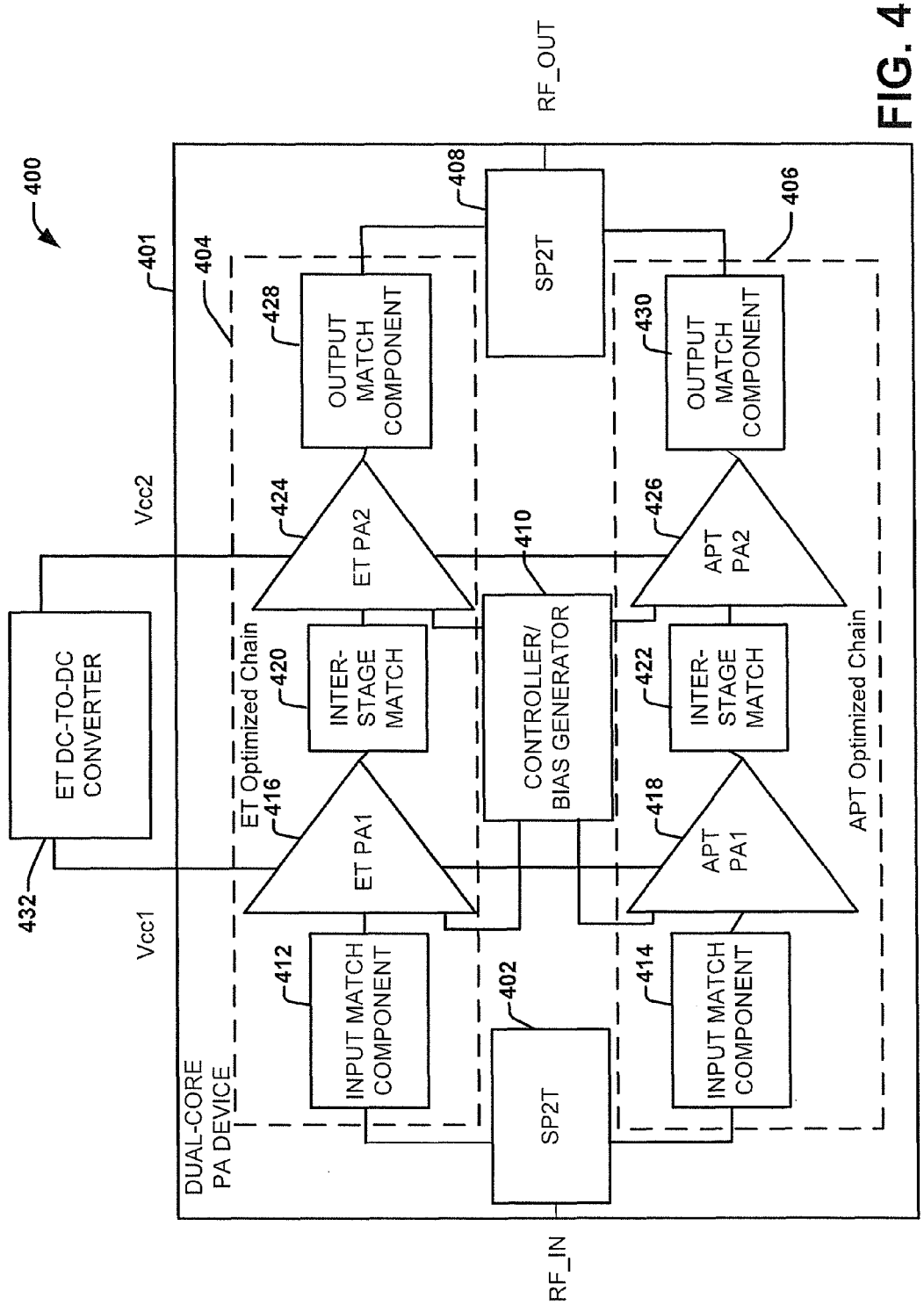
FIG. 4 is a block diagram illustrating another PA system or device according to various aspects described.

Referring now to FIG. 4, illustrated is another example of a PA system 400 having a dual-core PA device for generating output power via a plurality of PA chains in accordance with various aspects described. The PA system 400 comprises at least one first PA chain 404 and at least one second PA chain 406 that operatively couples components of one or more power amplifiers as PA cores that include supporting components, such as matching components at input, output and intermediate stages, as well as power transistors (now shown). The first PA chain 404 comprises a first power amplifier 416 and a second power 424, and the second PA chain 406 comprises a third power amplifier 418 and a fourth power amplifier 426, in which each PA operates to generate a power output in different modes that correspond to the operation of each chain. Although two power amplifiers are comprised in each chain 404 and 406 respectively, more than two PAs or less than two PAs could be configured within each chain depending upon the architecture and application.

The ET optimized PA chain 404 includes the power amplifiers 416, 424 to generate an output power by operating in an envelope tracking mode of the dual-core PA device 401. The non-envelope tracking optimized PA chain 406 includes the power amplifiers 418 and 426 to generate an output power by operating in an APT mode or non-ET mode of the dual-core PA device 401. In one embodiment, the PAs 416 and 424 of the ET optimized PA chain 404 are selected from a first class (e.g., class-E) or type of power amplifier, and the PAs 418 and 426 of the APT optimized chain 406 are selected from a different class (e.g., class-F) or type of power amplifier. For example, a PA that is optimized for ET performance in ET mode, such as PA 416 or 424, is different from the PA 418 or 426 optimized for non-ET mode. These differences can affect and provide for differences among the inter-stage match components 420, 422, the load-line selections of PAs in each chain, harmonic terminations or the general class of operation.

For example, ET optimized PAs of the chain 404 can be a class-E type for operation due to highest saturated efficiency, whereas a class-F mode PA provides for an improved linearity and efficiency in the APT mode in comparison. Differences in the PAs of the different chains 404, 406, for example, can be significant enough to initiate a performance degradation when switching between modes (e.g., in the switchable output matching of the output match components 428, 430) while continuing to generate power from the same chain optimized for one mode or the other. This means that an optimal performance in ET or APT mode can be utilized with an optimization or specialization of the entire PA chain and core(s) for one mode giving up performance when the PA device of another chain is selected to operate in the other mode.

In another embodiment, the PAs 416, 424 of the first chain 404 comprises a different load-line than the PAs 418, 424 of the second chain 406. For example, the PAs 416 and 424 can comprise a high load-line, or a load-line that is above about 3.2V to 3.4V to achieve a maximum power, which is more efficient for operating in ET mode, while the PAs 418, 426 of the second chain 406 can comprise a low load-line that is at or below the range of about 3.2V to 3.4V, for example.

An operational voltage range of a PA core can be indicated by a PA load-line, which can be from the load-impedance at the output of the last PA stage, such as at an input or output of the output match components 428 and 430, for example. The higher the load-line of a PA or PA core, then the higher the PA supply voltage that is provided to achieve or meet a maximum output power target. No particular general definition exists, but one of ordinary skill in the art of PAs can consider a PA with a high load-line as a PA that receives more than about 3.2V to 3.4V to meet a maximum linear power in non-ET mode or APT mode. Thus, a PA with a low load-line receives less than the about 3.2V to 3.4V for achieving maximum power. Consequentially, a PA with a high load-line can sometimes have a DCDC converter with DC boost capability coupled thereto to achieve the maximum linear power in APT mode. However, an ET tracking PA with AC boost can still support the maximum output power of a PA with a high load-line when operating in ET mode. Additionally, a PA with a higher load-line can achieve a higher peak-efficiency and be more convenient for ET modes than a PA with a low low-line.

In another aspect, each PA chain 404 and 406 respectively comprises an input match component 412 and 414 that operates to match the input signal impedances with the respective PA operation input, such as with source impedance and load impedance matching from the input signal (RF_in) to the first PAs 416, 418 of the chains. In addition, each stage comprises an inter-stage matching component 420, 422 and an output match component 424 and 426, for example, for providing a power output to the output component 408.

The PA system 400 further comprises an ET DCDC converter 432 that provides different supply voltages in the ET mode than in the APT mode to the respective PA chains 404, 406 in order to support various supply voltages to PAs of each chain 404,406. For example, the ET DCDC converter 432 operates to provide a supply voltage (e.g., a variable envelope voltage) to the PA chain 404 for envelope tracking operations, and further operates to provide another or different supply voltage to the PA chain 406 to support non-ET mode or APT mode operations. The ET DCDC converter 432 thus can also support a maximal or peak linear power in APT mode for the non-ET chain 406. In one embodiment, a maximal power range can be approximately equal in both PA chains for the ET mode and the non-ET mode during power generation operations, while the supply voltages to each are different from one another.

In some cases, an ET DCDC converter can support a constant voltage and a modulated output supply for APT mode and for the ET mode. The ET DCDC converter 432 could operate with or without an AC boost, which means the peak output voltage during the ET operation can be higher than a battery voltage. A DC boost operation can used when the supply voltage range of the PA supply voltage is higher than the battery voltage. In ET systems, for example, without a DC boost component, the maximum linear output can be observed as only being achieved in an ET mode of operation due to AC boost, but not in APT modes where only a constant supply voltage or is supplied for average power tracking techniques. This can be a constraint because critical 3GPP test cases at Pmax are passed in ET mode if the maximum power is not supported in an APT mode. Thereby, having two modes supported by the ET DCDC converter 432 provides an optimal support in power generation.

In one example, an Up-link carrier aggregation (UL CA), a 3GPP Release 10 feature, could increase the bandwidth (up to about 100 MHz) and allow a non-contiguous resource block (RB) allocation in combination with multi-cluster PUSCH and simultaneous PUSCH-PUSCH transmission. As a result the spectrum is fragmented in separated clusters with different cluster sizes (which equals the number of resources blocks assigned to a cluster). Higher bandwidth fragmented spectrum (resulting in higher power densities) are severe challenges for an envelope tracking system. Thus, to mitigate the risk of having to support the higher LTE channel bandwidth, the maximum linear power in non-ET mode (e.g., APT mode) can be generated in the PA chain 406.

The modulation responses (e.g., AMAM- and AMPM response) of a PA can be different for the non-ET mode, in which the PAs 418, 426 operate in a linear region or in linearity) and for the ET mode, in which the PAs 416, 424 operate in saturation, near saturation or at a compression point. In ET mode the AMAM response is normally linearized by the ET shaping function (e.g., a pre-distortion component couple in the ET signal path, but not in the RF signal path to the PA) limiting DPD need for AMPM correction in the RF signal path, for example.

In another embodiment, the different PA cores or PAs of each chain 404 and 406 operate in or support the same frequency range or frequency of operation within a same frequency range, and thus approximately similar maximum output powers (e.g., about 28 dBm).

The switching component 402 at an input (e.g., RF input) of the PA device 401 can comprise one or more switches such as a single pole, double/dual throw switch, or other switch to connect the input RF signal (RF_in) to either the APT optimized core or chain 404 or the ET optimized core or chain 406. In addition, the output component 408 can be another switch of the same or different type as the input switch component 402, such as a single pole, double pole (e.g., SP2T). The SP2T switch, for example, at the output component 408 can achieve an insertion loss of less than 0.2 dB. Both PA cores or PA chains 404 and 406 can be integrated on a same die, or processing substrate (e.g., an HBT die). HBT die size of a linear PA can be around 0.5 sqmm. Thus, an extra or additional PA can increase the HBT die size from about 0.5 to about 1 sqmm.

In another embodiment, the ET optimized PA chain 404 can utilize distortion such as a digital distortion components coupled thereto for mitigating non-linearity in the power generation while operating in saturation or at a compression, while the non-ET optimized PA chain 406 operates independently of any distortion component (e.g., inverse non-linearity factors or polynomial factors/coefficients) or without any distortion or pre-distortion. In cases where UL CA is supported (e.g., intra-band contiguous CA) of class C, there can be up to five resource block clusters or even more in future 3GPP releases, for example, present in the signal, which are distributed across the approximate 38 MHz channel bandwidth. The five clusters are due to UL CA together with MC-PUSCH and simultaneous PUSCH-PUCCH. The AMAM and AMPM response of the PA heavily depends on the loading conditions. If the PA is loaded, for example, by a duplexer, then multiple AMAM/AMPM responses depending on the cluster location within the channel bandwidth can exist. In more extreme cases, an AMAM/AMPM cloud representing the memory can be seen, which is introduced by the duplexer. DPD implementation accounting for wideband memory effects can be complex and perhaps impossible. Thus, in some UL CA use cases the non-ET mode is advantageous due to potential high bandwidth and multiple clusters (e.g., about 5 or other threshold amount) with a high power density, which otherwise cause high intermodulation products when operating in ET mode.

The controller 410 can operate as a bias generator for creating a bias to the PAs of each of the PA chains. The controller 410 can also operate to determine conditions or predetermined criteria by which the switch selects the ET chain 404 for ET mode or the non-ET chain 406 for non-ET mode of power generation. Alternative or additionally, the information or data can be communicated or utilized via a baseband processor of the device. The criteria can be related to a complexity of the input signal (e.g., RF_in), such as whether the signal is 3GPP or LTE for selecting an ET mode of operation. Additionally, a bandwidth could be determined or received to determine whether the bandwidth is over a threshold, for example of 20 to 40 MHz, or whether an advanced LTE signal is at a higher bandwidth (e.g., about 100 MHz) to select the non-ET mode of operation. The signals can be analyzed for determining whether multiclass signals are being received, in which the spectrum is not continuous, but in discreet blocks or clusters, which requires less interpolation processes, to select the non-ET mode of operation.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5:
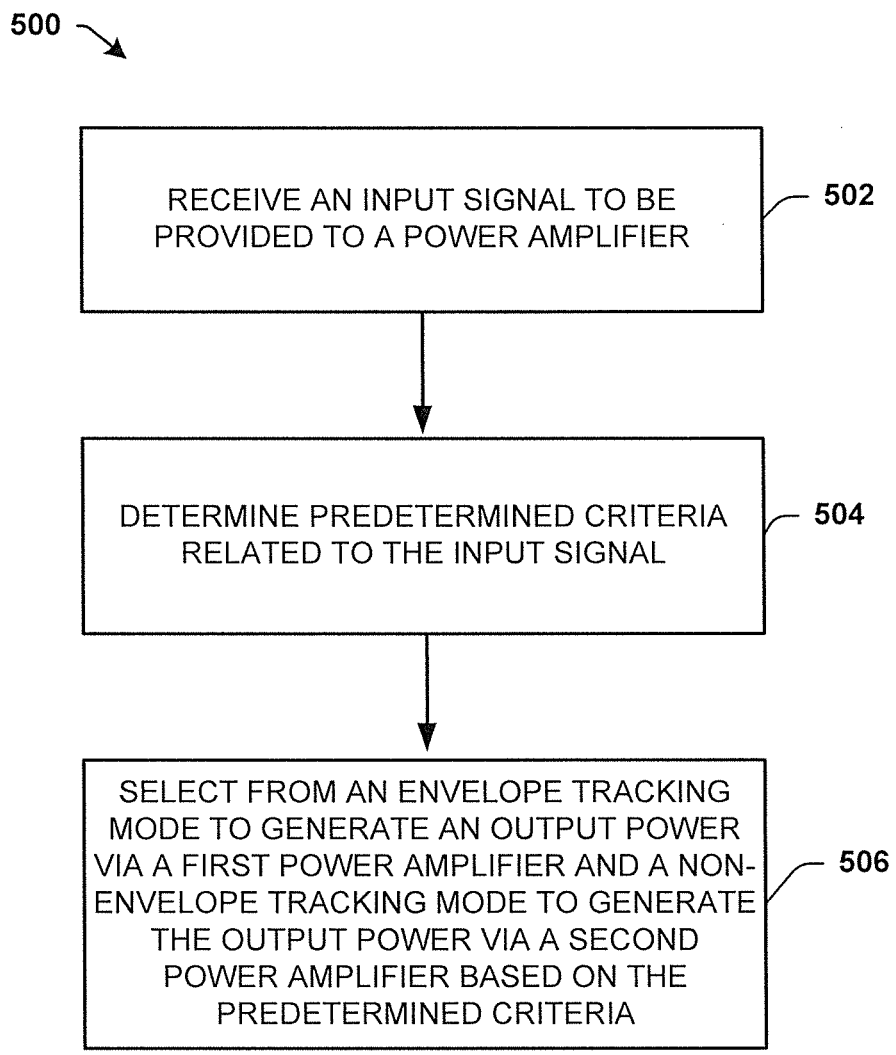
FIG. 5 is flow diagram illustrating a method of operating a PA system or device according to various aspects described.

Referring to FIG. 5, illustrated is a method 500 for generating an output power via a dual core, dual mode PA device that dynamically adjusts from a first PA core to a second PA core based on identified conditions for an input signal. The method 500 initiates at 502 with receiving a set (one or more) of input signals at an input terminal of the power amplifier system.

At 504, the method comprises determining a set of predetermined criteria related to the set of input signals at the input terminal.

At 506, the method further comprises selecting from an envelope tracking mode to generate an output power via a first power amplifier and a non-envelope tracking mode to generate the output power via a second power amplifier based on the set of predetermined criteria.

In response to the envelope tracking mode being selected, a first voltage supply is supplied to the first power amplifier to generate a first power output at a first saturated power in a frequency range of operation, and in response to the non-envelope tracking mode being selected, a second voltage supply is selected to the second power amplifier to generate a second power output at a second saturated power in about the same frequency range of operation. The first voltage supply and the second voltage supply are different from one another while a same or similar maximum output power can be achieved by the first power amplifier or the second power amplifier. In addition, the first power amplifier can be configured to operate in saturation or at a compression point with a good linearity, while the second power amplifier operates in linearity.

The set of predetermined criteria, for example, can comprise a predefined condition based on at least one of a spectrum characteristic of the input signal at the input terminal, a bandwidth of the input signal, a contiguity of the spectrum characteristic, or a number of spectral clusters and a distance between spectral clusters in response to a spectrum of the input signal being determined as non-contiguous.

In one embodiment, the PA system can switch to the first power amplifier to operate in the envelope tracking mode of operation in response to the set of input signals of the input terminal satisfying or exceeding a defined threshold of a bandwidth as the set of predetermined criteria, and switch to the second power amplifier to operate in the non-envelope tracking mode of operation in response to the input signal of the input terminal not satisfying or being below the defined threshold of the bandwidth.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a power amplifier device that comprises a first power amplifier configured to generate a first output power at a frequency based on an envelope tracking mode of operation, and a second power amplifier configured to generate a second output power at the frequency based on a non-envelope tracking mode of operation. The first power amplifier and the second power amplifier are selectively activated based on a set of predetermined criteria.

Example 2 includes the subject matter of Example 1, wherein the set of predetermined criteria comprises a predefined condition based on at least one of a spectrum characteristic of an input signal at an input terminal, a bandwidth of the input signal, a contiguity of the spectrum characteristic, or a number of spectral clusters and a distance between spectral clusters in response to a spectrum of the input signal is non-contiguous.

Example 3 includes the subject matter of any of Examples 1 and 2, including or omitting optional elements, wherein the first power amplifier is configured to achieve an optimal performance of operation by generating the first output power with a high efficiency that is higher than an efficiency of the second power amplifier, and wherein the second power amplifier is configured to generate the second output power with a high linearity that is higher than a linearity of the first power amplifier.

Example 4 includes the subject matter of any of Examples 1-3, including or omitting optional elements, wherein the first output power of the first power amplifier and the second output power of the second power amplifier comprise a maximum output power that is approximately a same maximum output power or a same range of maximum output power within a same frequency range of operation in response to a supply voltage provide by a DC-to-DC converter.

Example 5 includes the subject matter of any of Examples 1-4, including or omitting optional elements, wherein the first power amplifier and the second power amplifier are further configured to generate the first output power and the second output power with different supply voltages being received from the DC-to-DC converter.

Example 6 includes the subject matter of any of Examples 1-5, including or omitting optional elements, further comprising a DC-to-DC converter configured to provide a supply voltage to the first power amplifier or the second power amplifier, and adjust the supply voltage based on the first output power or the second output power.

Example 7 includes the subject matter of any of Examples 1-6, including or omitting optional elements, further comprising a switching component, selectively coupled to the first power amplifier and the second power amplifier, configured to couple an input signal of an input terminal to one of the first power amplifier or the second power amplifier based on the set of predetermined criteria.

Example 8 includes the subject matter of any of Examples 1-7, including or omitting optional elements, wherein the set of predetermined criteria comprises a predefined condition of whether the bandwidth of the input signal exceeds a predetermined threshold frequency that is within a range of about 20 to 40 MHz.

Example 9 is a power amplifier system comprising a first power amplifier chain comprising at least one first power amplifier core configured to generate a first output in response to an envelope tracking mode of operation, and a second power amplifier chain comprising at least one second power amplifier core configured to generate a second output in response to a non-envelope tracking mode of operation. The first power amplifier chain and the second power amplifier chain are configured to selectively operate in the envelope tracking mode and the non-envelope tracking mode respectively based on a set of predetermined criteria.

Example 10 includes the subject matter of Example 9, wherein the first power amplifier chain in the envelope tracking mode of operation and the second power amplifier chain in the non-envelope tracking mode of operation are configured to generate approximately a same maximum output power.

Example 11 includes the subject matter of Examples 9 and 10, wherein the at least one first power amplifier core comprises a higher load-line to achieve a maximum output power than the at least one second power amplifier core to achieve the maximum output power.

Example 12 includes the subject matter of any of Examples 9-11, including or omitting optional elements, wherein the at least one first power amplifier core differs from the at least one second power amplifier core in at least one of a load-line selection, a harmonic termination, or class of operation.

Example 13 includes the subject matter of any of Examples 9-12, including or omitting optional elements, wherein the at least one first power amplifier chain and the at least one second power amplifier chain are located on a same transistor die and are coupled to a DC-to-DC converter to receive a different supply voltage.

Example 14 includes the subject matter of any of Examples 9-13, including or omitting optional elements, wherein the at least one first power amplifier core is further configured to operate within a different supply voltage range than the at least one second power amplifier core.

Example 15 includes the subject matter of any of Examples 9-14, including or omitting optional elements, further comprising a distortion component, coupled to the at least one first power amplifier core, configured to reduce non-linearity in a generation of a first output power by the at least one first power amplifier core in the envelope tracking mode of operation by providing a distortion correction to a power input or a power output of the at least one first power amplifier core. The at least one second power amplifier core is further configured to operate in the non-envelope tracking mode of operation independently of the distortion correction from the distortion component.

Example 16 includes the subject matter of any of Examples 9-15, including or omitting optional elements, wherein the set of predetermined criteria comprise a set of input characteristics related to an input signal at an input terminal of the switching component.

Example 17 includes the subject matter of any of Examples 9-16, including or omitting optional elements, wherein the set of input characteristics comprise at least one of a bandwidth or a continuity characteristic of a spectrum of the input signal.

Example 18 includes the subject matter of any of Examples 9-17, including or omitting optional elements, wherein the switching component is further configured to activate the non-envelope tracking mode of operation in response to a bandwidth of an input signal at the input terminal exceeding a defined threshold or a discontinuity being detected in the input signal at the input terminal.

Example 19 includes the subject matter of any of Examples 9-18, including or omitting optional elements, wherein the set of predetermined criteria comprises a target output power and a complexity of an input signal at an input terminal based on at least one of bandwidth, a number of random bits, a number of clusters, a cluster size, or a number of gaps in multi-cluster transmissions.

Example 20 includes the subject matter of any of Examples 9-19, including or omitting optional elements, wherein the at least one first power amplifier core comprises a first power amplifier of a first class and the at least one second power amplifier core comprises a second power amplifier of a second class that is different from the first class.

Example 21 is a method for a power amplifier system comprising receiving a set of input signals at an input terminal of the power amplifier system; determining a set of predetermined criteria related to the set of input signals at the input terminal; and selecting from an envelope tracking mode to generate an output power via a first power amplifier and a non-envelope tracking mode to generate the output power via a second power amplifier based on the set of predetermined criteria.

Example 22 includes the subject matter of Example 21, further comprising in response to the envelope tracking mode being selected, supplying a first voltage supply to the first power amplifier to generate a first power output at a first saturated power in a frequency range of operation; and in response to the non-envelope tracking mode being selected, supplying a second voltage supply to the second power amplifier to generate a second power output at a second saturated power in the frequency range of operation, wherein the first voltage supply and the second voltage supply are different from one another.

Example 23 includes the subject matter of any of Examples 21 and 22, including or omitting optional elements, wherein the set of predetermined criteria comprises a predefined condition based on at least one of a spectrum characteristic of the input signal at the input terminal, a bandwidth of the input signal, a contiguity of the spectrum characteristic, or a number of spectral clusters and a distance between spectral clusters in response to a spectrum of the input signal being determined as non-contiguous.

Example 24 includes the subject matter of any of Examples 21-23, including or omitting optional elements, further comprising generating a maximum output power in the envelope tracking mode of operation in response to switching to the first power amplifier to operate in the envelope tracking mode of operation; and generating the maximum output power in the non-envelope tracking mode of operation in response to switching to the second power amplifier to operate in the non-envelope tracking mode of operation.

Example 25 includes the subject matter of any of Examples 21-24, including or omitting optional elements, switching to the first power amplifier to operate in the envelope tracking mode of operation in response to the set of input signals of the input terminal satisfying or exceeding a defined threshold of a bandwidth as the set of predetermined criteria; and switching to the second power amplifier to operate in the non-envelope tracking mode of operation in response to the input signal of the input terminal not satisfying or being below the defined threshold of the bandwidth.

Example 26 is a system comprising a means for receiving a set of input signals at an input terminal of a power amplifier device; a means for determining a set of predetermined criteria related to the set of input signals at the input terminal; and a means for selecting from an envelope tracking mode to generate an output power via a first power amplifier of the power amplifier device and a non-envelope tracking mode to generate the output power via a second power amplifier of the power amplifier device based on the set of predetermined criteria.

Example 27 includes the subject matter of Example 26, further comprising in response to the envelope tracking mode being selected, a means for supplying a first voltage supply to the first power amplifier to generate a first power output at a first saturated power in a frequency range of operation; and in response to the non-envelope tracking mode being selected, a means for supplying a second voltage supply to the second power amplifier to generate a second power output at a second saturated power in the frequency range of operation, wherein the first voltage supply and the second voltage supply are different from one another.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A power amplifier device comprising:
    a first power amplifier configured to generate a first output power at a frequency based on an envelope tracking mode of operation;
    a second power amplifier configured to generate a second output power at the frequency based on a non-envelope tracking mode of operation;
    a switching component, selectively coupled to the first power amplifier and the second power amplifier, configured to couple an input signal of an input terminal to one of the first power amplifier or the second power amplifier based on a set of predetermined criteria;
    wherein the first power amplifier and the second power amplifier are selectively activated based on the set of predetermined criteria.

2. The power amplifier device of claim 1, wherein the set of predetermined criteria comprises a predefined condition based on at least one of a spectrum characteristic of an input signal at an input terminal, a bandwidth of the input signal, a contiguity of the spectrum characteristic, or a number of spectral clusters and a distance between spectral clusters in response to a spectrum of the input signal is non-contiguous.

3. The power amplifier device of claim 1, wherein the first power amplifier is configured to achieve an optimal performance of operation by generating the first output power with a high efficiency that is higher than an efficiency of the second power amplifier, and wherein the second power amplifier is configured to generate the second output power with a high linearity that is higher than a linearity of the first power amplifier.

4. The power amplifier device of claim 1, wherein the first output power of the first power amplifier and the second output power of the second power amplifier comprise a maximum output power that is approximately a same maximum output power or a same range of maximum output power within a same frequency range of operation in response to a supply voltage provide by a DC-to-DC converter.

5. The power amplifier device of claim 4, wherein the first power amplifier and the second power amplifier are further configured to generate the first output power and the second output power with different supply voltages being received from the DC-to-DC converter.

6. The power amplifier device of claim 1, further comprising:
    a DC-to-DC converter configured to provide a supply voltage to the first power amplifier or the second power amplifier, and adjust the supply voltage based on the first output power or the second output power.

7. The power amplifier device of claim 1, wherein the set of predetermined criteria comprises a predefined condition of whether the bandwidth of the input signal exceeds a predetermined threshold frequency that is within a range of about 20 to 40 MHz.

8. A power amplifier system comprising:
    a first power amplifier chain comprising at least one first power amplifier core configured to generate a first output in response to an envelope tracking mode of operation; and
    a second power amplifier chain comprising at least one second power amplifier core configured to generate a second output in response to a non-envelope tracking mode of operation,
    a switching component, selectively coupled to the at least one first power amplifier core and the at least one second power amplifier core, configured to couple an input signal of an input terminal to one of the at least one first power amplifier core or the second power amplifier core based on a set of predetermined criteria;
    wherein the first power amplifier chain and the second power amplifier chain are configured to selectively operate in the envelope tracking mode and the non-envelope tracking mode respectively based on the set of predetermined criteria.

9. The power amplifier system of claim 8, wherein the first power amplifier chain in the envelope tracking mode of operation and the second power amplifier chain in the non-envelope tracking mode of operation are configured to generate approximately a same maximum output power.

10. The power amplifier system of claim 8, wherein the at least one first power amplifier core comprises a higher load-line to achieve a maximum output power than the at least one second power amplifier core to achieve the maximum output power.

11. The power amplifier system of claim 8, wherein the at least one first power amplifier core differs from the at least one second power amplifier core in at least one of a load-line selection, a harmonic termination, or class of operation.

12. The power amplifier system of claim 8, wherein the first power amplifier chain and the second power amplifier chain are located on a same transistor die and are coupled to a DC-to-DC converter to receive a different supply voltage.

13. The power amplifier system of claim 8, wherein the at least one first power amplifier core is further configured to operate within a different supply voltage range than the at least one second power amplifier core.

14. The power amplifier system of claim 8, further comprising:
    a distortion component, coupled to the at least one first power amplifier core, configured to reduce non-linearity in a generation of a first output power by the at least one first power amplifier core in the envelope tracking mode of operation by providing a distortion correction to a power input or a power output of the at least one first power amplifier core;
    wherein the at least one second power amplifier core is further configured to operate in the non-envelope tracking mode of operation independently of the distortion correction from the distortion component.

15. The power amplifier system of claim 8, wherein the set of predetermined criteria comprise a set of input characteristics related to an input signal at an input terminal of the switching component.

16. The power amplifier system of claim 15, wherein the set of input characteristics comprise at least one of a bandwidth or a continuity characteristic of a spectrum of the input signal.

17. The power amplifier system of claim 8, wherein the switching component is further configured to activate the non-envelope tracking mode of operation in response to a bandwidth of an input signal at the input terminal exceeding a defined threshold or a discontinuity being detected in the input signal at the input terminal.

18. The power amplifier system of claim 8, wherein the set of predetermined criteria comprises a target output power and a complexity of an input signal at an input terminal based on at least one of bandwidth, a number of random bits, a number of clusters, a cluster size, or a number of gaps in multi-cluster transmissions.

19. The power amplifier system of claim 8, wherein the at least one first power amplifier core comprises a first power amplifier of a first class and the at least one second power amplifier core comprises a second power amplifier of a second class that is different from the first class.

20. A method for a power amplifier system comprising:
receiving a set of input signals at an input terminal of the power amplifier system;
determining a set of predetermined criteria related to the set of input signals at the input terminal;
selecting from an envelope tracking mode to generate an output power via a first power amplifier and a non-envelope tracking mode to generate the output power via a second power amplifier based on the set of predetermined criteria;
switching to the first power amplifier to operate in the envelope tracking mode of operation in response to the set of input signals of the input terminal satisfying or exceeding a defined threshold of a bandwidth as the set of predetermined criteria; and
switching to the second power amplifier to operate in the non-envelope tracking mode of operation in response to the input signal of the input terminal not satisfying or being below the defined threshold of the bandwidth.

21. The method of claim 20, further comprising:
in response to the envelope tracking mode being selected, supplying a first voltage supply to the first power amplifier to generate a first power output at a first saturated power in a frequency range of operation; and
in response to the non-envelope tracking mode being selected, supplying a second voltage supply to the second power amplifier to generate a second power output at a second saturated power in the frequency range of operation, wherein the first voltage supply and the second voltage supply are different from one another.

22. The method of claim 21, wherein the set of predetermined criteria comprises a predefined condition based on at least one of a spectrum characteristic of the input signal at the input terminal, a bandwidth of the input signal, a contiguity of the spectrum characteristic, or a number of spectral clusters and a distance between spectral clusters in response to a spectrum of the input signal being determined as non-contiguous.

23. The method of claim 20, further comprising:
generating a maximum output power in the envelope tracking mode of operation in response to switching to the first power amplifier to operate in the envelope tracking mode of operation; and
generating the maximum output power in the non-envelope tracking mode of operation in response to switching to the second power amplifier to operate in the non-envelope tracking mode of operation.

* * * * *